US011418122B2

(12) United States Patent
Kobayashi et al.

(10) Patent No.: US 11,418,122 B2
(45) Date of Patent: Aug. 16, 2022

(54) INTEGRATED CIRCUIT AND POWER SUPPLY CIRCUIT

(71) Applicant: FUJI ELECTRIC CO., LTD., Kawasaki (JP)

(72) Inventors: YoshinorI Kobayashi, Matsumoto (JP); Takato Sugawara, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/328,429

(22) Filed: May 24, 2021

(65) Prior Publication Data

US 2022/0038013 A1    Feb. 3, 2022

(30) Foreign Application Priority Data

Jul. 29, 2020  (JP) .............................. JP2020-128429

(51) Int. Cl.
*H02M 3/335*    (2006.01)
*G11C 17/18*    (2006.01)
*H02M 1/088*    (2006.01)
*G11C 17/16*    (2006.01)

(52) U.S. Cl.
CPC ......... *H02M 3/33569* (2013.01); *G11C 17/18* (2013.01); *H02M 1/088* (2013.01); *G11C 17/16* (2013.01)

(58) Field of Classification Search
CPC ... H02M 3/33569; H02M 1/088; G11C 17/18; G11C 17/16

USPC ......................................................... 327/540
See application file for complete search history.

(56) References Cited

U.S. PATENT DOCUMENTS

2022/0038009 A1*  2/2022  Maruyama ............. H03K 17/00

FOREIGN PATENT DOCUMENTS

| JP | 2003-110029 A | 4/2003 |
| JP | 2013-222397 A | 10/2013 |
| JP | 2019-062050 A | 4/2019 |
| WO | 2018/216136 A1 | 11/2018 |

* cited by examiner

*Primary Examiner* — Tomi Skibinski
(74) *Attorney, Agent, or Firm* — Rabin & Berdo, P.C.

(57) ABSTRACT

An integrated circuit for a power supply circuit that generates an output voltage from an input voltage and includes an inductor and a transistor, the integrated circuit configured to switch the transistor to control a current of the inductor. The integrated circuit includes a first terminal that receives a power supply voltage, a second terminal that receives a voltage corresponding to an operation state of the integrated circuit, a storage circuit, a switching circuit that switches an operation mode of the integrated circuit based on voltage levels at the first and second terminals, the operation mode including a write mode, a test mode and a normal mode, a memory control circuit that writes setting information into the storage circuit, when the integrated circuit operates in the write mode, and a setting target circuit that operates based on the setting information stored in the storage circuit, when the integrated circuit operates in the test mode.

13 Claims, 12 Drawing Sheets

| Page | Byte | APPLICATION |
|---|---|---|
| 0 | 0 | REFERENCE VOLTAGE TRIMMING (vref) |
| | 1 | A PIN FUNCTION SWITCHING (sel) |
| | 2 | CLOCK-UP SETTING (clkcntl) |
| | 3 | ... |
| | | ⋮ |
| 1 | 0 | DEAD TIME (deadtime) |
| | 1 | ... |
| | | ⋮ |

FIG.5

INTEGRATED CIRCUIT AND POWER SUPPLY CIRCUIT

The present application claims priority pursuant to 35 U.S.C. § 119 from Japanese patent application number 2020-128429 filed on Jul. 29, 2020, the entire disclosure of which is hereby incorporated by reference herein.

BACKGROUND

Technical Field

The present disclosure relates to an integrated circuit and a power supply circuit.

Description of the Related Art

Integrated circuits that control power supply circuits may, for example, incorporate memory (for example, EPROM) that stores data for trimming to adjust an operation of the integrated circuit (for example, Japanese Patent Application Publication No. 2003-110029).

Such an integrated circuit including memory is generally provided with a dedicated terminal for writing data into the memory. However, when the dedicated terminal (test terminal and/or the like) is used, the number of pins in the integrated circuit increases.

The present disclosure is directed to provision of a technique capable of adjusting an operation of an integrated circuit without using a dedicated terminal.

SUMMARY

An aspect of the present disclosure is an integrated circuit for a power supply circuit that generates an output voltage at a target level from an input voltage, the power supply circuit including an inductor, and a transistor configured to control an inductor current flowing through the inductor, the integrated circuit being configured to perform switching of the transistor, the integrated circuit comprising: a first terminal that receives a power supply voltage for operating the integrated circuit; a second terminal that receives a voltage corresponding to an operation state of the integrated circuit; a storage circuit; a switching circuit configured to switch an operation mode of the integrated circuit based on voltage levels at the first and second terminals, the operation mode including a write mode, a test mode and a normal mode; a memory control circuit configured to write setting information into the storage circuit, when the integrated circuit operates in the write mode; and a setting target circuit configured to operate based on the setting information stored in the storage circuit, when the integrated circuit operates in the test mode.

Another aspect of the present disclosure is a power supply circuit configured to generate an output voltage at a target level from an input voltage, the power supply circuit comprising: an inductor; a transistor configured to control an inductor current flowing through the inductor; and an integrated circuit configured to perform switching of the transistor, wherein the integrated circuit includes: a first terminal that receives a power supply voltage for operating the integrated circuit; a second terminal that receives a voltage corresponding to an operation state of the integrated circuit; a storage circuit; a switching circuit configured to switch an operation mode of the integrated circuit based on voltage levels at the first and second terminals, the operation mode including a write mode, a test mode and a normal mode; a memory control circuit configured to write setting information into the storage circuit, when the integrated circuit operates in the write mode; and a setting target circuit configured to operate based on the setting information stored in the storage circuit, when the integrated circuit operates in the test mode.

BRIEF DESCRIPTION OF THE DRAWINGS

FIG. 2 is a diagram illustrating an example of a configuration of a switching control IC 10a.

FIG. 5 is a diagram illustrating an example of memory allocation of a non-volatile memory 50.

DETAILED DESCRIPTION

At least following matters will become apparent from the description of the present specification and the accompanying drawings.

Embodiment

<<Outline of DC-DC convertor 102>>

Figure 1:
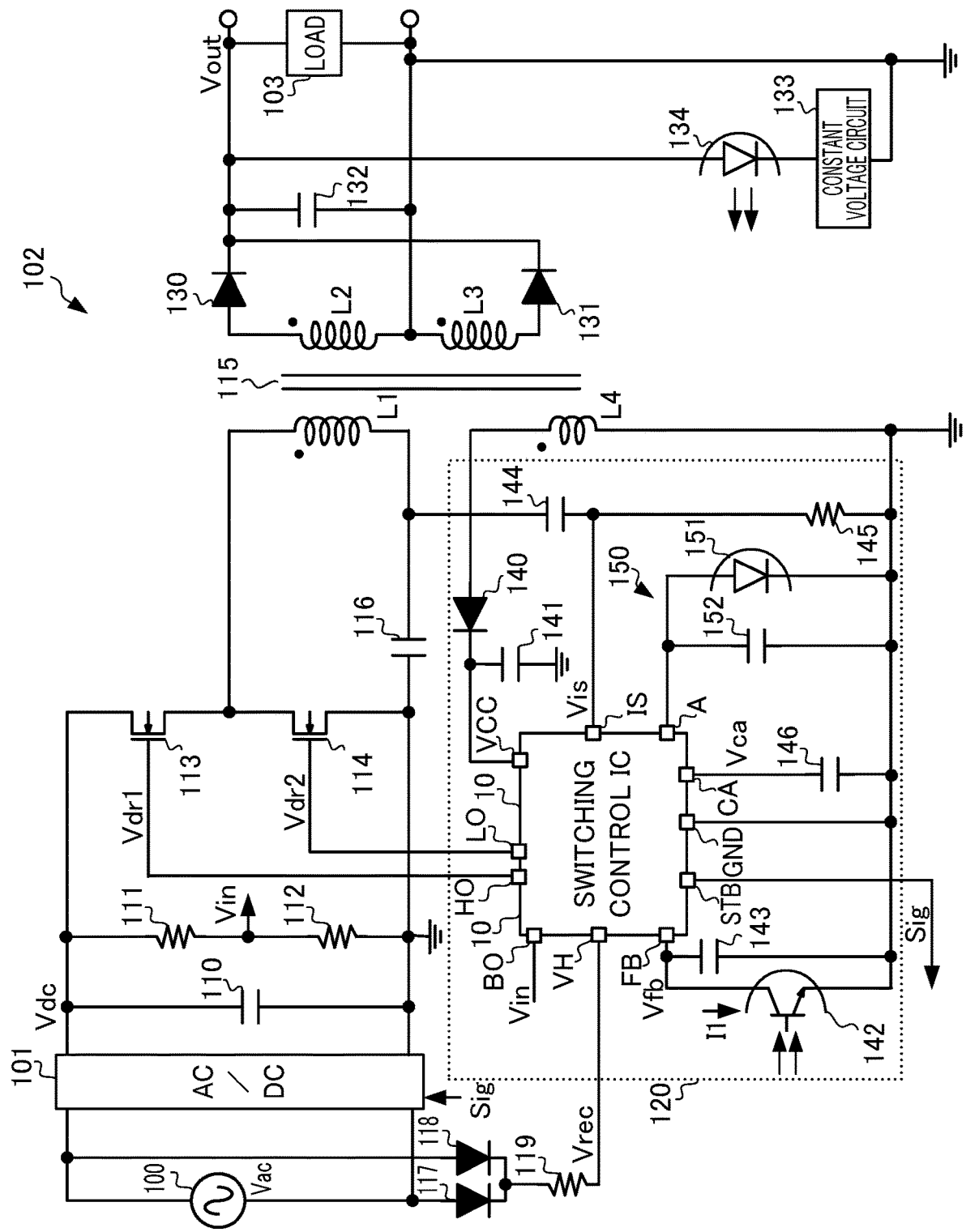
FIG. 1 is a diagram illustrating an example of a configuration of a DC-DC convertor 102.

FIG. 1 is a diagram illustrating an example of a configuration of a DC-DC convertor 102 according to one embodiment of the present disclosure. The DC-DC convertor 102 is a power supply circuit that drives a load 103 based on an input voltage Vdc of an AC-DC convertor 101 that converts an alternating current (AC) voltage Vac from an AC power supply 100 to the input voltage Vdc. Specifically, the DC-DC convertor 102 is an LLC current resonant convertor that generates an output voltage Vout of a target level from the input voltage Vdc for the load 103.

The DC-DC convertor 102 comprises capacitors 110, 116, and 132, resistors 111, 112, and 119, NMOS transistors 113 and 114, a transformer 115, a control block 120, diodes 117, 118, 130, and 131, a constant voltage circuit 133, and a light emitting diode 134.

The capacitor 110 stabilizes a voltage between a power supply line to which the input voltage Vdc is applied and a ground line on the ground side and removes noise. Note that the input voltage Vdc is a DC voltage at a predetermined level.

The resistors 111 and 112 are provided in series between the power supply line and the ground line, and divide the input voltage Vdc to generate a voltage Vin at a connection point of the resistors 111 and 112.

The NMOS transistor 113 is a high-side power transistor and the NMOS transistor 114 is a low-side power transistor. Note that, although the NMOS transistors 113 and 114 are used as switching devices in an embodiment of the present disclosure, for example, PMOS transistors, bipolar transistors, or the like may be used.

The transformer 115 includes a primary coil L1, secondary coils L2 and L3, and an auxiliary coil L4. The primary coil L1, a set of the secondary coils L2 and L3, and the auxiliary coil L4 are insulated from one another. In the transformer 115, a voltage is generated in the secondary coils L2 and L3 on the secondary side according to a variation in the voltage across the primary coil L1 on the primary side, and a voltage is generated in the auxiliary coil L4 on the primary side according to a variation in the voltage of the secondary coils L2 and L3.

Moreover, the primary coil L1 has one end connected to a source of the NMOS transistor 113 and a drain of the NMOS transistor 114, and the other end connected to a source of the NMOS transistor 114 via the capacitor 116.

Accordingly, when switching of the NMOS transistors 113 and 114 is started, the voltages of the secondary coils L2 and L3 and the auxiliary coil L4 vary. Note that the primary coil L1 and the secondary coils L2 and L3 are electromagnetically coupled with the same polarity, and the secondary coils L2 and L3 and the auxiliary coil L4 also are electromagnetically coupled with the same polarity.

The capacitor 116 is a so-called resonance capacitor that configures a resonance circuit with the primary coil L1.

The diodes 117 and 118 configure a full-wave rectifier circuit together with the resistor 119, rectifies the AC voltage Vac from the AC power supply 100, and applies a rectified voltage Vrec to a VH terminal of a switching control IC 10 (described later).

The control block 120 is a circuit block for controlling the switching of the NMOS transistors 113 and 114, and details thereof are described later.

The diodes 130 and 131 rectify the voltage of the secondary coils L2 and L3, and the capacitor 132 smooths the rectified voltages. As a result, the smoothed output voltage Vout is generated in the capacitor 132. Note that the output voltage Vout is the DC voltage at the target level.

The constant voltage circuit 133 generates a constant DC voltage, and is configured using, for example, a shunt regulator.

The light emitting diode 134 emits light having an intensity corresponding to a difference between the output voltage Vout and an output of the constant voltage circuit 133, and configures a photocoupler with a phototransistor 142 which will be described later. In an embodiment of the present disclosure, when the level of the output voltage Vout rises, the intensity of the light from the light emitting diode 134 increases.

Note that the primary coil L1 corresponds to an "inductor", and a current flowing through the primary coil L1 corresponds to an "inductor current".

<<<Control Block 120>>>

The control block 120 includes the switching control IC 10, capacitors 141, 143, 144, and 146, a resistor 145, a diode 140, and the phototransistor 142.

The switching control IC 10 is an integrated circuit that controls the switching of the NMOS transistors 113 and 114, and have terminals VCC, GND, VH, BO, STB, FB, IS, CA, A, HO, and LO.

The terminal VCC is a terminal to which a power supply voltage Vcc for operating the switching control IC 10 is applied. A cathode of the diode 140 and the capacitor 141 having one end grounded are connected to the terminal VCC. Accordingly, the capacitor 141 is charged with a current from the diode 140 and a charged voltage in the capacitor 141 results in the power supply voltage Vcc for operating the switching control IC 10.

Note that the switching control IC 10 includes a startup circuit 23 (described later) that charges the capacitor 141 via the terminal VH to which the rectified voltage Vrec is applied. The switching control IC 10 is started by the power supply voltage Vcc charged by the startup circuit 23 and, after being started, operates based on the power supply voltage Vcc charged with a current from the auxiliary coil L4.

The terminal GND is a terminal to which a ground voltage is applied, and is connected to, for example, a case or the like of an apparatus in which the DC-DC convertor 102 is provided.

The terminal VH is a terminal to which the rectified voltage Vrec of the input voltage Vdc is applied, and supplies the rectified voltage Vrec to the startup circuit 23 (described later).

The terminal BO is a terminal to which the input voltage Vin is applied. A circuit that controls an operation of the switching control IC 10 is connected to the terminal BO, and details thereof are described later.

The terminal FB is a terminal at which a feedback voltage Vfb corresponding to the output voltage Vout is generated and to which the phototransistor 142 and the capacitor 143 are connected. The capacitor 143 is provided to remove noise between the terminal FB and the ground, and the phototransistor 142 causes a bias current I1 having a magnitude corresponding to the intensity of light from the light emitting diode 134 to flow from the terminal FB to the ground. Thus, the phototransistor 142 operates as a transistor that generates a sink current.

The terminal IS is a terminal to which a Vis corresponding to the input voltage of the DC-DC convertor 102 is applied. Here, a voltage corresponding to a current value of the resonance current in the primary coil L1 is generated at a node to which the capacitor 144 and the resistor 145 are connected. Accordingly, a voltage corresponding to the current value of the resonance current in the primary coil L1 is applied to the terminal IS.

Note that the current value of the resonance current increases according to the input voltage of the DC-DC convertor 102, and the input voltage of the DC-DC convertor 102 increases according to power consumed by the load 103. Accordingly, the voltage applied to the terminal IS indicates a voltage corresponding to the power consumed by the load 103.

The terminal CA is a terminal to which the capacitor 146 is connected and at which a voltage corresponding to the state of the load 103 is generated based on the voltage Vis generated at the terminal IS.

The terminal STB is a terminal from which a communication signal for changing a switching mode of the AC-DC convertor 101 corresponding to a switching mode of the DC-DC convertor 102 is outputted to a power factor correction IC (not illustrated) of the AC-DC convertor 101.

The terminal HO is a terminal from which a drive signal Vdr1 for driving the NMOS transistor 113 is outputted and to which a gate of the NMOS transistor 113 is connected.

The terminal LO is a terminal from which a drive signal Vdr2 for driving the NMOS transistor 114 is outputted and to which a gate of the NMOS transistor 114 is connected.

The terminal A is a terminal to which a circuit is connected which is selected, by a fuse, among three circuits (power supply abnormality detection circuit (PGS) 17, overheat protection circuit (OTP) 18, and external abnormality detection circuit (MODE) 19) incorporated in the switching control IC 10. In an embodiment of the present disclosure, the PGS 17 is connected to the terminal A. Note that details of the PGS 17, the OTP 18, and the MODE 19 are described later.

An external circuit 150 is an external circuit in the case where the PGS 17 is connected to the terminal A, and comprises a light emitting diode 151 and a capacitor 152. When the power supply that supplies power to the switching control IC 10 is normal, the PGS 17 supplies a source current to the terminal A. Meanwhile, when there is abnormality in the power supply that supplies power to the switching control IC 10, the PGS 17 stops supplying the source current to the terminal A. Accordingly, when the source current is stopped, the light emitting diode 151 is turned off. Moreover, when the light emitting diode 151 and a phototransistor (not illustrated) configure a photocoupler, the photocoupler provides notification of the abnormality in the power supply of the switching control IC 10 to the outside. Note that the capacitor 152 is provided to stabilize the voltage generated at the terminal A.

<<<Details of Switching Control IC 10a>>>

Figure 2:
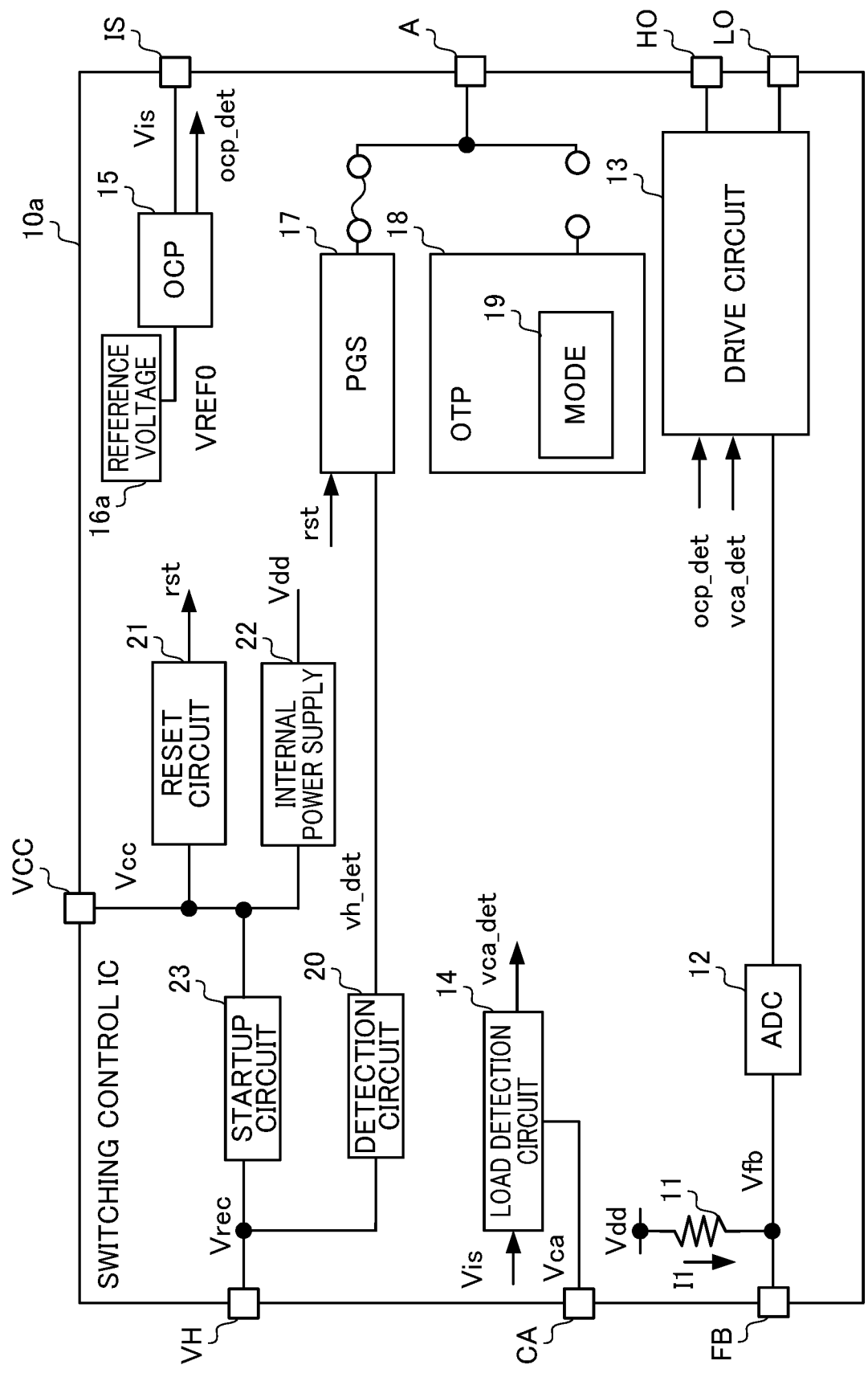

FIG. 2 is a diagram illustrating an example of a configuration of a switching control IC 10a according to one embodiment of the switching control IC 10, the switching control IC 10a including a trimming element (not illustrated) and a fuse. The switching control IC 10a is an integrated circuit that controls the switching of the NMOS transistors 113 and 114. The switching control IC 10a comprises a resistor 11, an analog-digital convertor (ADC) 12, a drive circuit 13, a load detection circuit 14, an overcurrent detection circuit (OCP) 15, a reference voltage generation circuit 16a, the PGS 17, the OTP 18, the MODE 19, a detection circuit 20, a reset circuit 21, an internal power supply 22, and the startup circuit 23. Note that the terminals BO and STB are omitted since they are not related to operations of the switching control IC 10a. Moreover, the terminal GND is omitted for the sake of convenience.

The ADC 12 is a circuit that converts, to a digital value, the voltage Vfb that is generated with the sink current I1 from the phototransistor 142 flowing through the resistor 11 that pulls up the terminal FB to a voltage Vdd. In this description, the voltage Vfb converted to the digital value is also referred to as the voltage Vfb. The voltage Vfb is outputted to the drive circuit 13. Note that the voltage Vdd is generated from the power supply voltage Vcc by the internal power supply 22.

The drive circuit 13 generates the drive signals Vdr1 and Vdr2 each having a switching frequency corresponding to a difference between the voltage Vfb and a reference value corresponding to the output voltage Vout of the target level. Here, the drive signals Vdr1 and Vdr2 are generated to have a duty ratio of about 50% complementarily with a dead time.

Note that the "dead time" refers to, for example, a time period from when the drive signal Vdr1 changes from a high level (hereinafter, referred to as high or high level) to a low level (hereinafter, referred to as low or low level) to when the drive signal Vdr2 changes to high, and thus is the time period during which both of the drive signals Vdr1 and Vdr2 are low.

In addition, when the OCP 15 (described later) detects that the current flowing through the primary coil L1 is an overcurrent and outputs a high signal ocp_det, the drive circuit 13 stops generating the drive signals Vdr1 and Vdr2.

The load detection circuit 14 smooths the voltage Vis corresponding to the power consumed by the load 103 and outputs the state of the load 103. Specifically, the load detection circuit 14 charges the capacitor 146 based on the voltage Vis that is to be applied to the terminal IS and outputs a signal vca_det indicating the state of the load 103 according to a voltage Vca at the terminal CA.

Accordingly, the voltage Vca results in a voltage proportional to the power consumed by the load 103 and thus indicates the state of the load 103, and the switching control IC 10a can switch the switching mode of the DC-DC convertor 102 to a normal mode or a burst mode, based on the voltage Vca. Then, the drive circuit 13 generates the drive signals Vdr1 and Vdr2, based on the switching mode of the DC-DC convertor 102 corresponding to the signal vca_det.

Note that the "normal mode" is, for example, a mode of continuously performing the switching operation such that the drive signals Vdr1 and Vdr2 are alternately high without intermittently stopping the switching operation. The "burst mode" is, for example, a mode of repeating the continuous switching operation, in which the drive signals Vdr1 and Vdr2 are alternately high, and a stop operation, in which the switching operation is intermittently stopped. Moreover, while the DC-DC convertor 102 operates in the normal mode, the DC-DC convertor 102 is not operating in the burst mode, and thus a time period during which the normal mode is operated corresponds to a time period during which the burst mode operation is not operated.

The OCP 15 is a circuit that determines whether the current flowing through the primary coil L1 is an overcurrent, and compares the voltage Vis applied to the terminal IS and a reference voltage VREF0 from the reference voltage generation circuit 16a (described later). Then, when the voltage Vis is higher than the reference voltage VREF0 for a predetermined time period, the OCP 15 outputs the high signal ocp_det.

The reference voltage generation circuit 16a generates the reference voltage VREF0 that is supplied to the OCP 15, and makes adjustment such that the reference voltage VREF0, which is a desired voltage, obtained by trimming with a trimming element is outputted.

The PGS 17 is a circuit that detects abnormality in the power supply that supplies power to the switching control IC 10a, and is connected to the terminal A via a fuse. In addition, the PGS 17 detects abnormality in the power supply of the switching control IC 10a based on a signal vh_det from the detection circuit 20 (described later), a reset signal rst from the reset circuit 21 (described later), or the like. Then, when the PGS 17 detects abnormality, the PGS 17 stops supplying the source current to the outside of the switching control IC 10a via the terminal A. As a result, the light emitting diode 151 is turned off.

The OTP 18 is a circuit that detects the temperature in the DC-DC convertor 102, and when the temperature rises, causes the drive circuit 13 to stop generating the drive signals Vdr1 and Vdr2 to prevent the DC-DC convertor 102 from being destroyed, and stops the operation of the DC-DC convertor 102.

The MODE 19 is a circuit that causes the drive circuit 13 to stop generating the drive signals Vdr1 and Vdr2 in response to a signal from the outside, and when a low signal is inputted to the terminal A, causes the drive circuit 13 to stop generating the drive signals Vdr1 and Vdr2. Note that details of the PGS 17, the OTP 18, and the MODE 19 are described later.

The switching control IC 10a includes the PGS 17, the OTP 18, and the MODE 19, however, in an embodiment of the present disclosure, a fuse between the terminal A and the OTP 18, MODE 19 opens, and thus the PGS 17 is connected to the terminal A.

The detection circuit 20 detects whether the amplitude of the AC voltage Vac is lower than a predetermined level for a predetermined time period by comparing a voltage obtained by dividing the rectified voltage Vrec with a reference voltage of a predetermined level. Specifically, when the voltage obtained by dividing the rectified voltage Vrec is lower than the reference voltage of the predetermined level for the predetermined time period, the detection circuit 20 generates a high signal vh_det indicating that the amplitude of the AC voltage Vac is lower than the predetermined level. Meanwhile, when the voltage obtained by dividing the rectified voltage Vrec is higher than the reference voltage of the predetermined level, the detection circuit 20 generates a low signal vh_det. Note that the signal vh_det is used for the PGS 17 to detect abnormality in the AC power supply 100.

When the power supply voltage Vcc (for example, 16 V in a normal state) for operating the switching control IC 10a drops below a predetermined voltage (for example, 9 V), the reset circuit 21 outputs a high reset signal rst. As a result, the switching control IC 10a is reset in response to the high reset signal rst. Note that, when "reset is released", the switching control IC 10a becomes operable, and when the "reset" is performed, the switching control IC 10a stops operating.

Meanwhile, when the power supply voltage Vcc becomes equal to or higher than the predetermined voltage, the reset circuit 21 outputs a low reset signal rst. When the low reset signal rst is outputted, in other words, the reset is released, the switching control IC 10a starts operating. Note that the PGS 17 uses the reset signal rst to detect abnormality in the power supply voltage Vcc.

Upon startup of the DC-DC convertor 102, the startup circuit 23 charges the capacitor 141, which is externally connected to the terminal VCC, according to the rectified voltage Vrec applied via the terminal VH, to raise the power supply voltage Vcc of the switching control IC 10a. Thus, the switching control IC 10a is supplied with the power supply voltage Vcc before the DC-DC convertor 102 starts switching, and the switching control IC 10a starts operating.
<<<Example of Operation of Switching Control IC 10a>>>

An example of an operation of the switching control IC 10a is described below. First, when the AC voltage Vac is supplied from the AC power supply 100, the rectified voltage Vrec is applied to the terminal VH. When the rectified voltage Vrec is applied thereto, the startup circuit 23 of the switching control IC 10a charges the capacitor 141 via the terminal VCC, to thereby raise the voltage Vcc. When the voltage Vcc exceeds the predetermined voltage (for example. 9V), the reset circuit 21 outputs the low reset signal rst. When the reset signal rst goes low, the reset of the switching control IC 10a is released.

When the reset is released, the drive circuit 13 generates the drive signals Vdr1 and Vdr2 at a switching frequency based on the voltage Vfb. Then, the capacitor 141 is charged depending according to the voltage generated in the auxiliary coil L4, and the voltage Vcc is maintained at a predetermined level with a current from the auxiliary coil L4.

Here, when the output voltage Vout is lower than the target level, the intensity of the light of the light emitting diode 134 decreases, which results in a decrease in the sink current I1 of the phototransistor 142. Then, when the sink current I1 decreases, the current I1 flowing through the resistor 11 of the switching control IC 10a decreases and the voltage Vfb rises.

Then, when the voltage Vfb rises, the drive circuit 13 generates the drive signals Vdr1 and Vdr2 at a lower switching frequency. As a result, the output voltage Vout rises to the target level.

Meanwhile, when the output voltage Vout rises from the target level, the intensity of the light of the light emitting diode 134 increases, which results in an increase in the sink current I1 of the phototransistor 142. Then, when the sink current I1 increases, the current I1 flowing through the resistor 11 of the switching control IC 10a increases, and the voltage Vfb drops.

When the voltage Vfb drops, the drive circuit 13 generates the drive signals Vdr1 and Vdr2 at a higher switching frequency. As a result, the output voltage Vout drops to the target level.

As such, with the drive circuit 13 generating the drive signals Vdr1 and Vdr2 on the basis of the voltage Vfb that is based on the level of the output voltage Vout, the DC-DC convertor 102 is feedback controlled by the switching control IC 10a such that the output voltage Vout is maintained at the target level.

Moreover, when the voltage Vca changes according to the power consumed by the load 103 and the load 103 becomes light load state, the load detection circuit 14 outputs the signal vca_det to change the switching mode of the switching control IC 10a to the burst mode. Note that the phrase "the load 103 becomes light load state" refers to, for example, the case where a value of a current flowing through the load 103 is lower than a predetermined value (for example, 1 mA) that indicates light load.

When the load 103 becomes light load state, the switching mode of the switching control IC 10a transitions to the burst mode, and the drive circuit 13 intermittently generates the drive signals Vdr1 and Vdr2.

Meanwhile, when the voltage Vca changes according to the power consumed by the load 103 and the load 103 becomes heavy load state, the load detection circuit 14 outputs the signal vca_det to change the switching mode of the switching control IC 10a to the normal mode. Note that the phrase "the load 103 becomes heavy load state" refers to, for example, the case where the value of the current flowing through the load 103 is greater than the predetermined value (for example, 1 mA) that indicates light load.

When the load 103 becomes heavy load state, the switching mode of the switching control IC 10a transitions to the normal mode, and the drive circuit 13 continuously generates the drive signals Vdr1 and Vdr2.

As such, the switching control IC 10a can output the drive signals Vdr1 and Vdr2 according to the state of the load 103, and thus the efficiency of the DC-DC convertor 102 is improved.

Moreover, the OCP 15 outputs the high signal ocp_det to the drive circuit 13 when the voltage Vis at the terminal IS is higher than the reference voltage VREF0 for the predetermined time period. Then, upon receiving the high signal ocp_det, the drive circuit 13 stops generating the drive signals Vdr1 and Vdr2. Accordingly, the OCP 15 can protect the switching control IC 10a from an overcurrent.

Furthermore, after the reset is released, the PGS 17 supplies the source current to the terminal A. Meanwhile, when the PGS 17 receives the high reset signal rst due to a drop in the voltage Vcc, or receives the high signal vh_det indicating that the amplitude of the AC voltage Vac is lower than a predetermined level, or the like, the PGS 17 stops supplying the source current to the terminal A. Accordingly, the light emitting diode 151 that is externally connected to the terminal A is turned off, thereby being able to notify a user X (hereinafter, a person who manufactures the DC-DC convertor 102 using the switching control IC 10a is referred to as the user X) of the DC-DC convertor 102 of abnormality in the power supply that is applied to the switching control IC 10a.

The operation of the general switching control IC 10a has been described above. In the switching control IC 10a, the reference voltage generation circuit 16a trimmed with the fuse, and one of the three circuits (PGS 17, OTP 18, MODE 19) is connected to the terminal A with the fuse.

Incidentally, although the state of the switching control IC 10a can be adjusted with the fuse, the switching control IC 10a cannot be restored to the original state once the fuse opens.

Moreover, for example, an EPROM can be used instead of the fuse. In such a case, generally, a terminal dedicated to writing information into the EPROM is needed. As a result, when the number of terminals in the switching control IC 10a is limited to a certain number, it is difficult to use the EPROM instead of the fuse.

Description is given below of a switching control IC 10b in which functions and circuits connected to terminals thereof are changeable without using a fuse or dedicated terminals.

<<<Details of Switching Control IC 10b>>>

Figure 3:
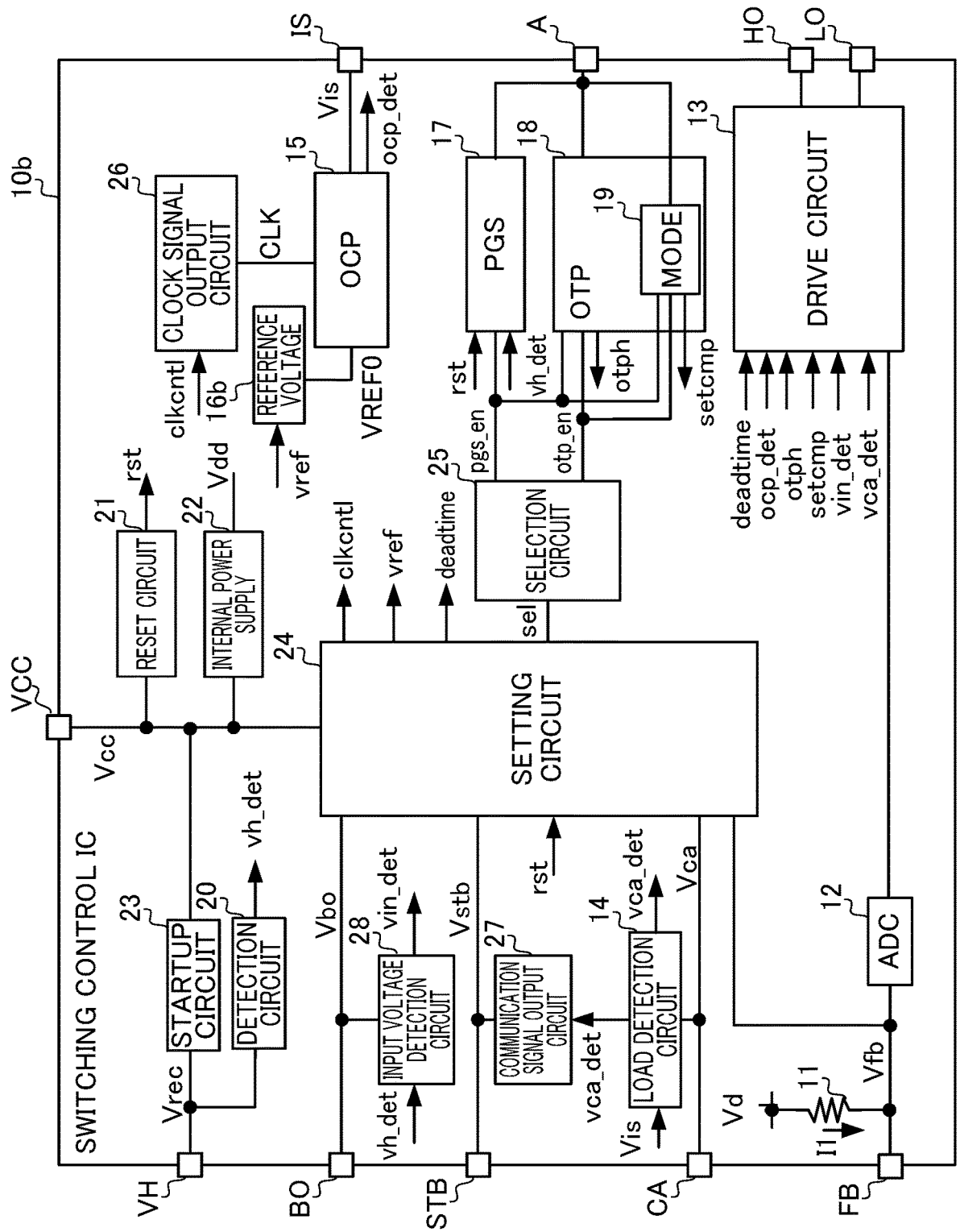
FIG. 3 is a diagram illustrating an example of a configuration of a switching control IC 10b.

FIG. 3 is a diagram illustrating an example of a configuration of the switching control IC 10b. The circuits that are the same between FIGS. 2 and 3 are given the reference numerals.

The switching control IC 10b is an integrated circuit that controls the switching of the NMOS transistors 113 and 114, similarly to the switching control IC 10a. The switching control IC 10b further includes a setting circuit 24, a selection circuit 25, a clock signal output circuit 26, a communication signal output circuit 27, and an input voltage detection circuit 28, in addition to the circuits in the switching control IC 10a.

The setting circuit 24 switches the operation mode of the switching control IC 10b based on the voltage levels at the terminals VCC, CA, and FB, as well as outputs pieces of setting information sel, clkcntl, vref, and deadtime. Note that details of the setting circuit 24 and the operation mode are described later.

The selection circuit 25 is for operating one of the three circuits (PGS 17, OTP 18, MODE 19) connected to the terminal A based on the setting information sel from the setting circuit 24, and outputs signals pgs_en and otp_en.

The clock signal output circuit 26 outputs a clock signal CLK to be used in the OCP 15 based on the setting information clkcntl from the setting circuit 24.

Moreover, in an embodiment of the present disclosure, a reference voltage generation circuit 16b outputs, to the OCP 15, the reference voltage VREF0 obtained by being trimmed with the setting information vref from the setting circuit 24. Accordingly, the OCP 15 uses the reference voltage VREF0 obtained by trimming, to be compared with the voltage Vis.

The drive circuit 13 generates the drive signals Vdr1 and Vdr2 based on the setting information deadtime from the setting circuit 24. Accordingly, the NMOS transistors 113 and 114 are driven in response to the drive signals Vdr1 and Vdr2 having a dead time that is set with the setting information deadtime.

The communication signal output circuit 27 outputs a communication signal to a power factor correction IC (not illustrated) that controls the AC-DC convertor 101 in response to a signal from the load detection circuit 14. The communication signal output circuit 27 changes the switching mode of the AC-DC convertor 101, according to the switching mode of the DC-DC convertor 102 corresponding to the signal vca_det, and causes the switching control IC 10b and the power factor correction IC to operate in cooperation.

Specifically, in the case where the load 103 is in the light load state and the DC-DC convertor 102 operates in the burst mode of the switching mode, the communication signal output circuit 27 outputs, to the power factor correction IC, a communication signal for causing the AC-DC convertor 101 to operate in the burst mode of the switching mode. Meanwhile, when the load 103 is in the heavy load state and the DC-DC convertor 102 operates in the normal mode of the switching mode, the communication signal output circuit 27 outputs, to the power factor correction IC, a communication signal for causing the AC-DC convertor 101 to operate in the normal mode of the switching mode.

The input voltage detection circuit 28 outputs a signal vin_det for causing the drive circuit 13 to start or stop the switching according to the level of a voltage Vbo at the terminal BO to which the voltage Vin is applied. When the voltage Vin rises to a predetermined level, the input voltage detection circuit 28 outputs a low signal vin_det for causing the drive circuit 13 to start generating the drive signals Vdr1 and Vdr2. Meanwhile, when the voltage Vin drops and the high signal vh_det is received, the input voltage detection circuit 28 outputs a high signal vin_det for causing the drive circuit 13 to stop generating the drive signals Vdr1 and Vdr2.

As a result, the switching control IC 10b starts the switching when the voltage Vin rises to a predetermined level, and stops the switching when the voltage Vin drops and the rectified voltage Vrec applied to the terminal VH satisfies a predetermined condition.

Note that the terminal VCC corresponds to a "first terminal", the terminal CA corresponds to a "second terminal", the terminal BO corresponds to a "third terminal", and the terminal A corresponds to a "fourth terminal". Moreover, the drive circuit 13, the OCP 15, the reference voltage generation circuit 16b, the PGS 17, the OTP 18, and the MODE 19 each correspond to a "setting target circuit". Moreover, the OTP 18 and the MODE 19 correspond to a "first detection circuit" and the PGS 17 corresponds to a "second detection circuit".

<<<Details of Setting Circuit 24>>>

Figure 4:
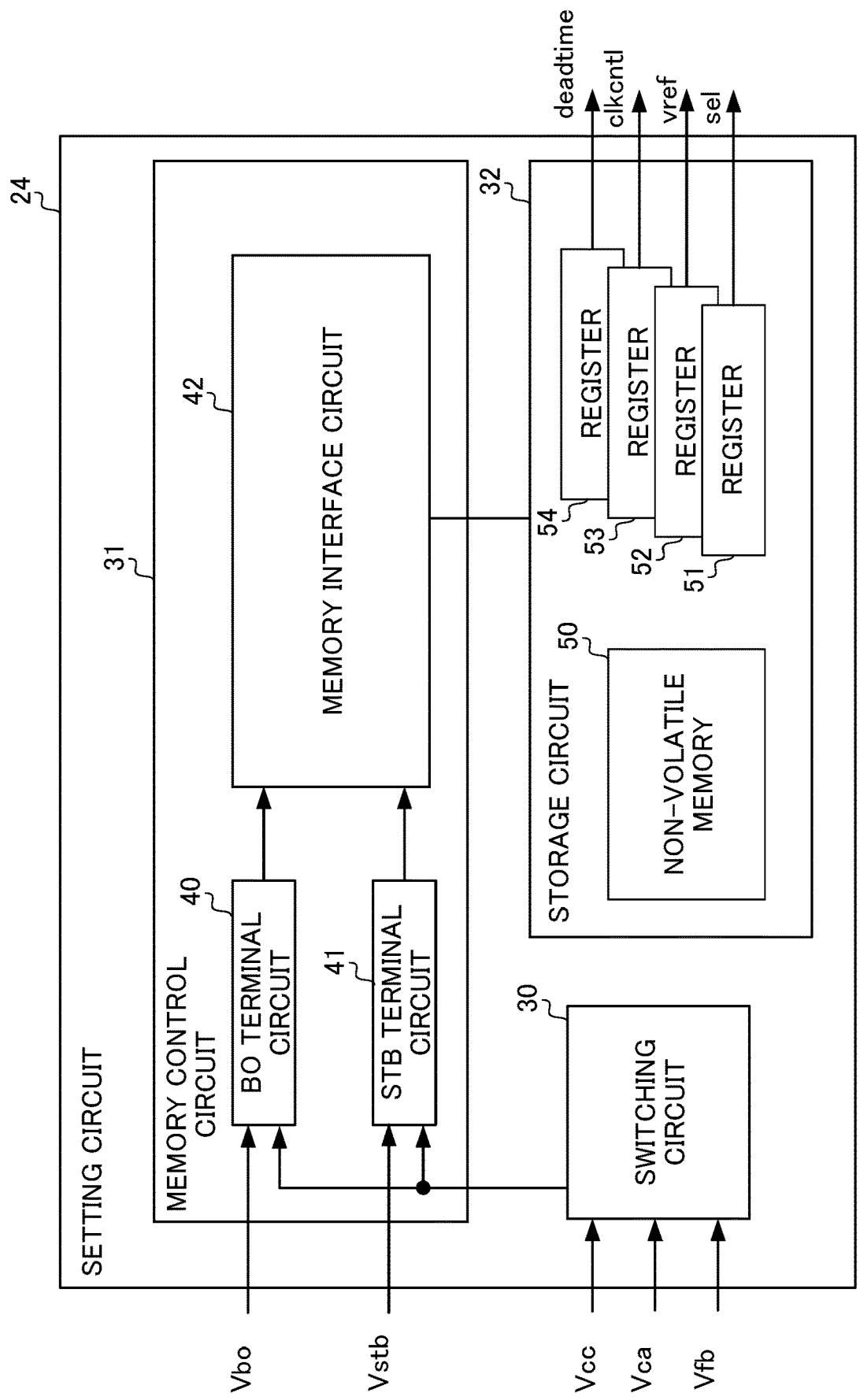
FIG. 4 is a diagram illustrating an example of a configuration of a setting circuit 24.

FIG. 4 is a diagram illustrating an example of a configuration of the setting circuit 24. The setting circuit 24 holds the setting information based on the voltages Vcc, Vca, Vfb, Vbo, and Vstb, and includes a switching circuit 30, a memory control circuit 31, and a storage circuit 32.

The switching circuit 30 switches the operation mode of the switching control IC 10b to one of a normal mode, a write 1 mode, a write 2 mode, and a test mode, based on the levels of the voltages Vcc, Vca, and Vfb.

Note that the "normal mode" is an operation mode in which the switching control IC 10b controls the DC-DC convertor 102. The "write 1 mode" is an operation mode in which information can be written into a region, in the storage circuit 32, where the user X of the DC-DC convertor 102 can be set. The "write 2 mode" is an operation mode in which information can be written into a region, in the storage circuit 32, where a manufacturer (also referred to as user Y) of the switching control IC 10b can be set before shipping of the switching control IC 10b. The "test mode" is an operation mode in which the circuits in the switching control IC 10b are operated to verify whether the circuits operates in a desired manner before shipping of the switching control IC 10b.

The memory control circuit 31 writes the setting information deadtime that can be set by the user X into the storage circuit 32, when the switching control IC 10b operates in the write 1 mode. Meanwhile, the memory control circuit 31 writes all the pieces of setting information sel, clkcntl, vref, and deadtime that can be set by the manufacturer (user Y) into the storage circuit 32, when the switching control IC 10b operates in the write 2 mode.

Moreover, the memory control circuit 31 includes a BO terminal circuit 40, a STB terminal circuit 41, and a memory interface circuit 42.

The BO terminal circuit 40 receives the clock signal that is inputted to the terminal BO, when the switching control IC 10b operates in the write 1 mode or the write 2 mode.

The STB terminal circuit 41 receives a data signal that is inputted into the terminal STB and that includes the setting information and information on a storage destination, when the switching control IC 10b operates in the write 1 mode or the write 2 mode.

The memory interface circuit 42 writes the setting information into the storage circuit 32 based on the clock signal and the data signal received by the BO terminal circuit 40 and the STB terminal circuit 41.

The storage circuit 32 stores the setting information and includes a non-volatile memory 50 and registers 51 to 54.

The pieces of setting information sel, clkcntl, vref, and deadtime in the case where the switching control IC 10b operates in the normal mode are stored in the non-volatile memory 50.

The setting information sel is stored in the register 51 and the pieces of setting information vref, clkcntl, and deadtime are similarly stored in the registers 52 to 54, respectively. Note that which of the non-volatile memory 50 and the registers 51 to 54 of the storage circuit 32 the memory interface circuit 42 writes the setting information into is described later. Moreover, differences in roles between the non-volatile memory 50 and the registers 51 to 54 are described later as well. Note that the BO terminal circuit corresponds to a "reception circuit" and the state in which the switching control IC 10b operates in the normal mode corresponds to an "operation state".

<<<Memory Allocation of Non-volatile Memory 50>>>

FIG. 5 is a diagram illustrating an example of memory allocation of the non-volatile memory 50. The non-volatile memory 50 is constituted by a memory having 128 bits×2 pages, for example.

In the non-volatile memory 50, the setting information that can be set only by the manufacturer (user Y) is stored in page 0, and the setting information that can be set by the user X and manufacturer (user Y) is stored in page 1. Specifically, the setting information to be set before shipping of the switching control IC 10b is stored in page 0, and the setting information to be set by the user X after shipping of the switching control IC 10b is stored in page 1.

In the non-volatile memory 50, a value of "reference voltage trimming (vref)", which is setting information for the reference voltage generation circuit 16b to be trimmed to generate the reference voltage VREF0, is stored in the 0th byte of page 0. Moreover, in the non-volatile memory 50, a value of "A pin function switching (sel)", which is setting information for determining which one of the PGS 17, the OTP 18, and the MODE 19 is to be connected to the terminal A, is stored in the 1st byte of page 0. Furthermore, in the non-volatile memory 50, a value of "clock-up setting (clkcntl)", which is setting information for determining which of the first clock signal and the second clock signal is to be outputted by the clock signal output circuit 26 is stored in the 2nd byte of page 0.

In the non-volatile memory 50, a value of "dead time (deadtime)", which is setting information on the dead time when the drive circuit 13 generates the drive signals Vdr1 and Vdr2, is stored in the 0th byte of page 1.

<<Details of OCP 15>>

Figure 6:
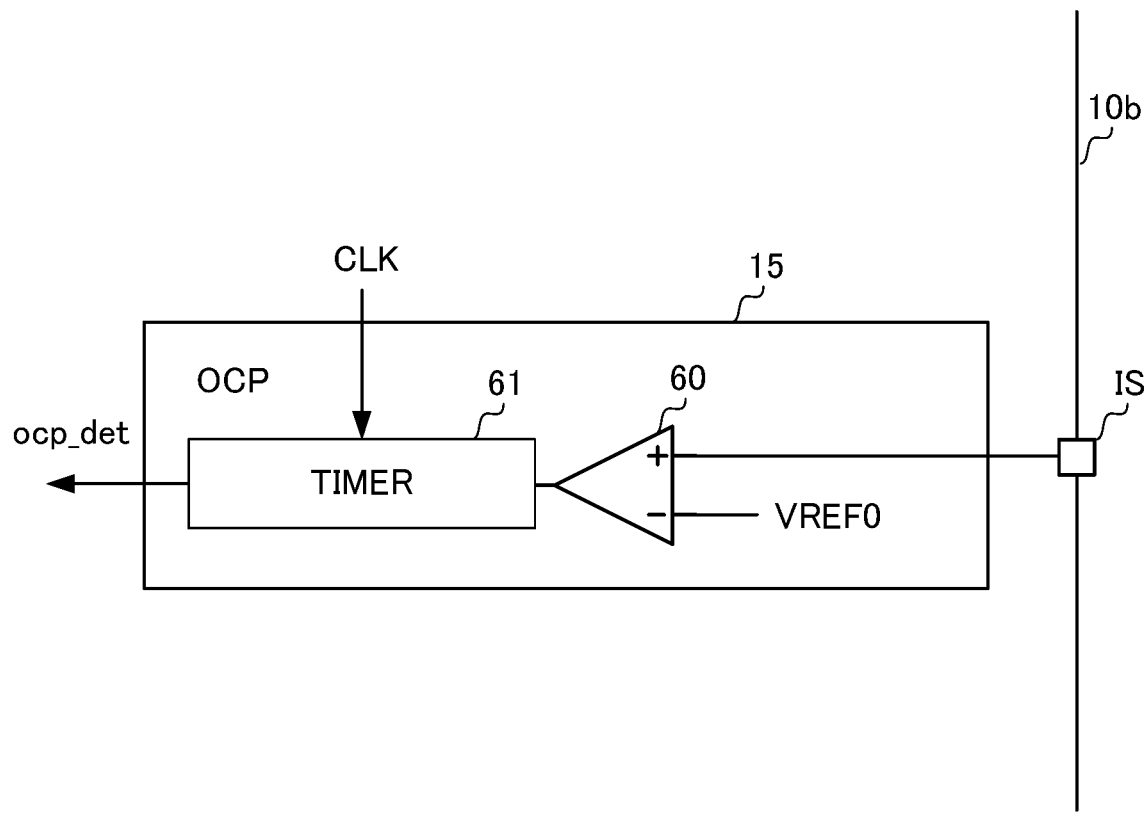
FIG. 6 is a diagram illustrating an example of a configuration of an OCP 15.

FIG. 6 is a diagram illustrating an example of a configuration of the OCP 15. The OCP 15 is a circuit that detects that the current flowing through the primary coil L1 is an overcurrent, and includes a comparator 60 and a timer 61.

The comparator 60 compares the voltage Vis at the terminal IS with the reference voltage VREF0 generated by the reference voltage generation circuit 16b, and outputs a high signal when the voltage Vis is higher than the reference voltage VREF0.

The timer 61 is a circuit that measures a time period during which the comparator 60 outputs the high signal. The timer 61 detects whether the high signal from the comparator 60 continues for a predetermined time period based on the clock signal CLK from the clock signal output circuit 26. Then, when the high signal continues for the predetermined time period, the timer 61 outputs the high signal ocp_det indicating that the current flowing through the primary coil L1 is an overcurrent.

Note that, when the switching control IC 10b operates in the normal mode, the clock signal output circuit 26 outputs the first clock signal as the clock signal CLK. Meanwhile, when the switching control IC 10b operates in the test mode, the clock signal output circuit 26 outputs the second clock signal having a frequency higher than that of the first clock signal, as the clock signal CLK.

Accordingly, when the switching control IC 10b operates in the test mode, the OCP 15 reduces a time period for measuring the predetermined time period as compared with the case where the switching control IC 10b operates in the normal mode. Thus, a test time period of the OCP 15 in the switching control IC 10b is reduced. Note that the timer 61 corresponds to a "digital circuit".

<<<Details of PGS 17, OTP 18, MODE 19>>>

Figure 7:
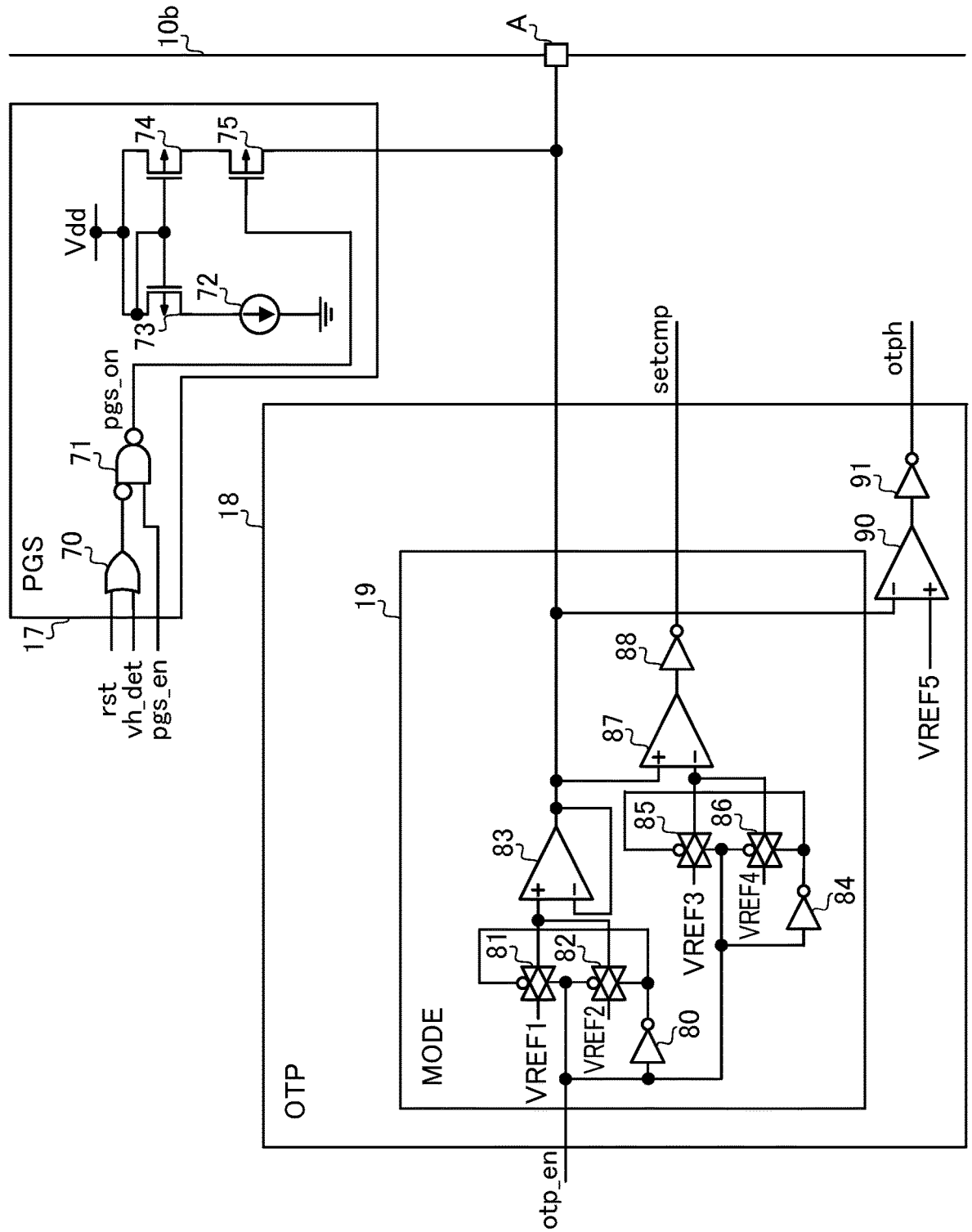
FIG. 7 is a diagram illustrating an example of configurations of a PGS 17, an OTP 18, and a MODE 19.

FIG. 7 is a diagram illustrating an example of configurations of the PGS 17, the OTP 18, and the MODE 19. When receiving a high signal pgs_en from the selection circuit 25, the PGS 17 operates. Meanwhile, when receiving a low signal pgs_en from the selection circuit 25, the OTP 18 or the MODE 19 operates. The configurations and operations of the PGS 17, the OTP 18, and the MODE 19 are described below.

<<<<PGS 17>>>>

The PGS 17 is a circuit that detects abnormality in the power supply of the switching control IC 10b. When the PGS 17 detects no abnormality in the power supply of the switching control IC 10b in the state where the signal pgs_en is high, the PGS 17 supplies the source current to the terminal A. Moreover, when the PGS 17 detects abnormality in the power supply of the switching control IC 10b in the state where the signal pgs_en is high, the PGS 17 stops supplying the source current to the terminal A. Meanwhile, when the signal pgs_en is low, the PGS 17 stops supplying the source current to the terminal A. In other words, the PGS 17 starts operating upon receiving the high signal pgs_en, and stops operating upon receiving the low signal pgs_en.

The PGS 17 includes an OR circuit 70, a NAND circuit 71, a constant current source 72, and PMOS transistors 73 to 75. The OR circuit 70 detects abnormality in the switching control IC 10b, and outputs a high signal when one of the signal vh_det from the detection circuit 20 and the reset signal rst from the reset circuit 21 is high.

The NAND circuit 71 outputs an output of the OR circuit 70 as a signal pgs_on upon receiving the high signal pgs_en, and outputs a high signal pgs_on upon receiving the low signal pgs_en.

The PMOS transistors 73 to 75 configure a current mirror circuit, and supply a source current proportional to a current passed by the constant current source 72, to the terminal A when the signal pgs_on is low. Accordingly, the PGS 17 notifies the user X of whether the power supply is normal through the photocoupler.

<<<<MODE 19>>>>

Next, to describe the operation of the OTP 18, the configuration and operation of the MODE 19 are described in advance.

The MODE 19 is a circuit that causes the drive circuit 13 to stop generating the drive signals Vdr1 and Vdr2 in response to a signal from the outside. When the MODE 19 receives a low signal otp_en and a voltage Va generated at the terminal A drops below a predetermined level, the MODE 19 causes the drive circuit 13 to stop generating the drive signals Vdr1 and Vdr2. Meanwhile, when the MODE 19 receives the low signal otp_en and the voltage Va generated at the terminal A exceeds the predetermined level, the MODE 19 causes the drive circuit 13 to resume generating the drive signals Vdr1 and Vdr2. The MODE 19 includes invertors 80, 84, and 88, transfer gates 81, 82, 85, and 86, and operational amplifiers 83 and 87.

The operational amplifier 83 clamps the terminal A to a reference voltage VREF2 in the normal operation, upon receiving the low signal otp_en. In this case, a predetermined source current is supplied to the terminal A.

Then, the operational amplifier 87 outputs a high signal setcmp to the drive circuit 13 via the invertor 88, when the voltage Va drops below a reference voltage VREF4, which is lower than the reference voltage VREF2, due to a state of an external circuit (not illustrated) connected to the terminal A. Meanwhile, the operational amplifier 87 outputs a low signal setcmp to the drive circuit 13 via the invertor 88, when the voltage Va exceeds the reference voltage VREF4 due to the state of the external circuit connected to the terminal A.

Then, the drive circuit 13 stops generating the drive signals Vdr1 and Vdr2 upon receiving the high signal setcmp, and resumes generating the drive signals Vdr1 and Vdr2 upon receiving the low signal setcmp.

Note that the startup circuit 23 of the switching control IC 10b maintains the power supply voltage Vcc at a predetermined voltage, while the drive circuit 13 stops generating the drive signals Vdr1 and Vdr2.

Accordingly, the MODE 19 causes the drive circuit 13 to stop or resume generating the drive signals Vdr1 and Vdr2 based on the level of the signal from the outside.

<<<<OTP 18>>>>

Meanwhile, upon receiving a high signal otp_en, the MODE 19 operates as part of the OTP 18. The OTP 18 is a circuit that detects the temperature in the DC-DC convertor 102, and includes a comparator 90 and an inverter 91, in addition to the MODE 19.

In this case, the operational amplifier 83 clamps the terminal A to a reference voltage VREF1 in the normal operation upon receiving the high signal otp_en. At this time, a predetermined source current is supplied to the terminal A.

Then, the operational amplifier 87 outputs the high signal setcmp to the drive circuit 13 via the invertor 88 when the voltage Va drops below a reference voltage VREF3 due to the external circuit connected to the terminal A. Meanwhile, the operational amplifier 87 outputs the low signal setcmp to the drive circuit 13 via the invertor 88, when the voltage Va exceeds the reference voltage VREF3 due to the external circuit connected to the terminal A.

Then, the drive circuit 13 stops generating the drive signals Vdr1 and Vdr2, upon receiving the high signal setcmp, and resumes generating the drive signals Vdr1 and Vdr2, when a predetermined time period has elapsed since the stopping of the generation thereof.

Moreover, the comparator 90 outputs a high signal otph to the drive circuit 13 via the invertor 91, when the voltage Va at the terminal A exceeds a reference voltage VREF5. Meanwhile, the comparator 90 outputs a low signal otph to the drive circuit 13 via the invertor 91, when the voltage Va drops below the reference voltage VREF5.

Then, upon receiving the high signal otph, the drive circuit 13 stops generating the drive signals Vdr1 and Vdr2 until the switching control IC 10b is reset.

<<<Operation of Switching Control IC 10b>>>

Figure 8:
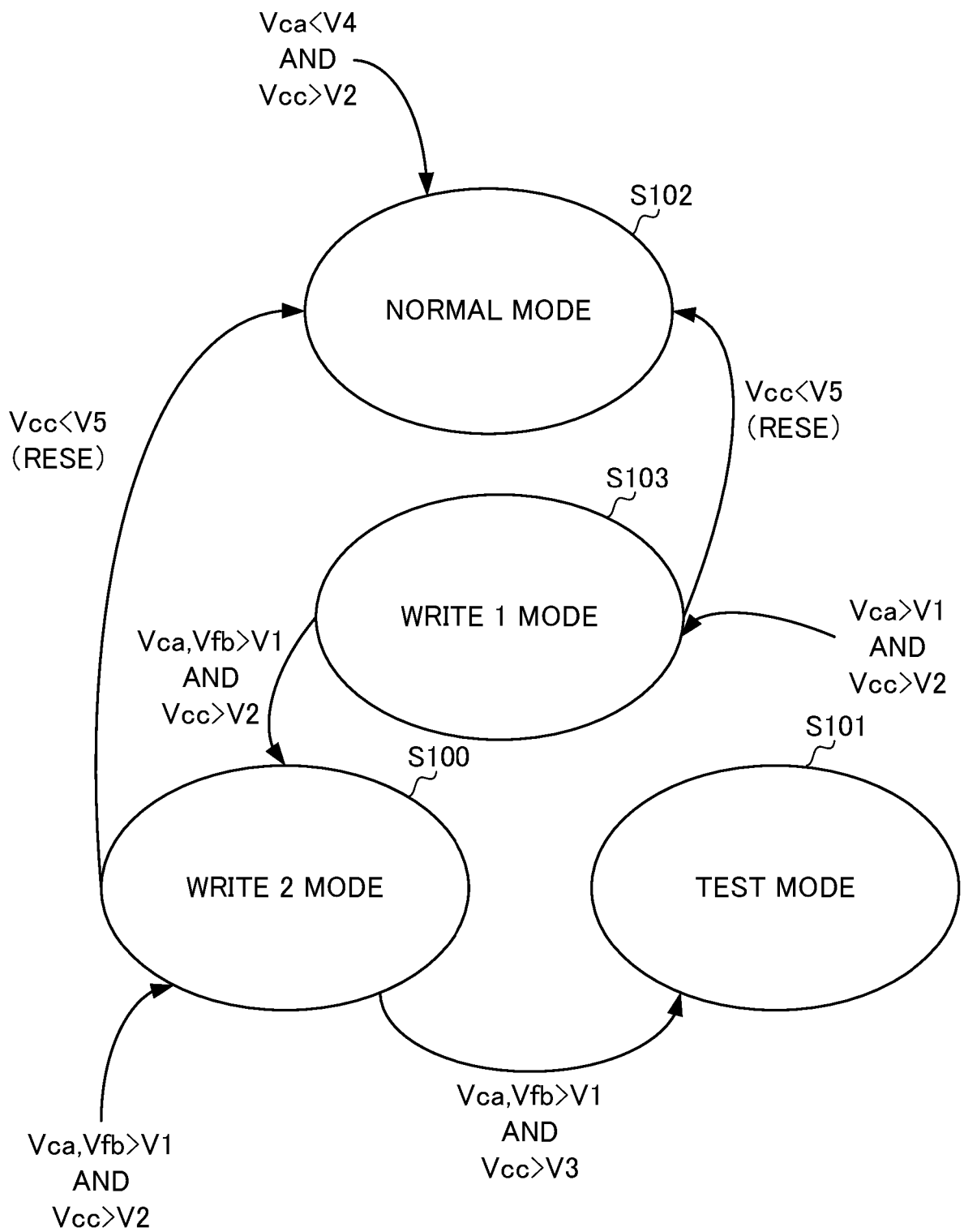
FIG. 8 is a diagram illustrating an example of transition conditions for an operation mode of the switching control IC 10b.

FIG. 8 is a diagram illustrating an example of conditions for transition of the operation mode of the switching control IC 10b. The operation mode of the switching control IC 10b transitions as illustrated in FIG. 8 based on the voltages Vcc, Vca, and Vfb at the terminals VCC, CA, and FB, respectively.

Description is given below of definition of whether the voltages Vcc, Vca, and Vfb fall within voltage ranges of the normal operation in which the switching control IC 10b controls the DC-DC convertor 102.

When the voltages Vca and Vfb fall within the voltage range of the normal operation, the voltages Vca and Vfb are between 0 V and a voltage V4 (for example, 3.8 V). Accordingly, when the voltages Vca and Vfb exceed a voltage V1 (for example, 4.2 V), the voltages Vca and Vfb are outside the voltage range of the normal operation. Note that the voltage range of the normal operation in the voltages Vca and Vfb corresponds to a "first range".

When the voltage Vcc falls within the voltage range of the normal operation, the voltage Vcc is between, for example, 9 V and 16 V. Accordingly, when the voltage Vcc exceeds a voltage V3 (for example, 26 V), the voltage Vcc is outside the voltage range of the normal operation. Moreover, when the voltage Vcc drops below a voltage V5 (for example, 9 V), the voltage Vcc is outside the voltage range of the normal operation. Accordingly, when the voltage Vcc is a voltage V2 (for example, 11 V), the voltage Vcc falls within the voltage range of the normal operation. Note that the voltage range of the normal operation in the voltage Vcc corresponds to a "second range".

Here, in an embodiment of the present disclosure, the user Y operates a tester (not illustrated) and applies predetermined voltages as the voltage Vca at the terminal CA, the voltage Vfb at the terminal FB, and the voltage Vcc at the terminal VCC, thereby causing the operation mode of the switching control IC 10b to transition. Note that the terminals of the switching control IC 10b other than the terminals CA, FB, and VCC each are connected to a predetermined element or the tester such that the switching control IC 10b can be tested.

First, description is given of the case where the switching control IC 10b transitions from the write 2 mode to the test mode.

<<<<Transition to Write 2 Mode>>>>

When the user Y operates the tester to set such that the voltages Vca and Vfb are higher than the voltage V1 (for example, 4.2 V) and the voltage Vcc is higher than the voltage V2 (for example, 11 V), the switching control IC 10b transitions to the write 2 mode (S100).

In this case, the switching circuit 30 causes the BO terminal circuit 40 and the STB terminal circuit 41 to operate. Then, the memory interface circuit 42 writes the setting information into the specified storage region in the storage circuit 32 based on the clock signal inputted via the terminal BO and the setting information inputted via the terminal STB. Specifically, the memory interface circuit 42 writes the pieces of setting information sel, clkcntl, vref, and deadtime into the non-volatile memory 50.

<<<<Transition from Write 2 Mode to Test Mode>>>>

Then, when the user Y operates the tester to set such that the voltages Vca and Vfb are maintained higher than the voltage V1 (for example, 4.2 V) and the voltage Vcc is higher than the voltage V3 (for example, 26 V), the switching control IC 10b transitions from the write 2 mode (S100) to the test mode (S101). Moreover, transitioning from the write 2 mode (S100) to the test mode (S101) by causing the voltage Vcc to be higher than the voltage V3 enables reduction in time period for transitioning from the write 2 mode to the test mode.

In this case, the switching circuit 30 stops the operations of the BO terminal circuit 40 and the STB terminal circuit 41. Then, the switching control IC 10b operates based on the pieces of setting information sel, clkcntl, vref, and deadtime written in the registers 51 to 54 in the write 2 mode (S100).

Note that, in the test mode (S101), the operation of the OCP 15 is verified by using the second clock signal selected based on the setting information clkcntl as the clock signal CLK and the reference voltage VREF0 obtained by trimming the reference voltage generation circuit 16b by using the setting information vref. Similarly, the operation of one of the three circuits (PGS 17, OTP 18, MODE 19) that operates based on the setting information sel is verified. Moreover, the drive circuit 13 generates the drive signals Vdr1 and Vdr2 having the dead time based on the setting information deadtime.

Then, when the switching control IC 10b performs a desired operation (for example, the reference voltage generation circuit 16b generates the predetermined reference voltage VREF0), the user Y operates the tester to set such that the switching control IC 10b transitions to the write 2 mode (S100). Then, the user Y operates the tester to set such that the pieces of setting information sel, vref, and deadtime written in the registers 51, 52, and 54 are written into predetermined portions of the non-volatile memory 50. Accordingly, it is possible to write, in the non-volatile memory 50, only the setting information with which the desired operation is verified in the test mode (S101).

Meanwhile, when the switching control IC 10b does not perform the desired operation (for example, the reference voltage generation circuit 16b does not generate the predetermined reference voltage VREF0), the user Y operates the tester to set such that the switching control IC 10b transitions to the write 2 mode (S100). Then, the user Y operates the tester to set such that the pieces of setting information sel, vref, and deadtime are written into the registers 51, 52, and 54 again. Then, the switching control IC 10b is caused to transition to the test mode again, to verify the operations of the reference voltage generation circuit 16b, one of the three circuits (PGS 17, OTP 18, MODE 19), and the drive circuit 13.

Next, description is given of the case where the switching control IC 10b transitions from the write 2 mode (S100) to the normal mode (S102).

<<<<Transition from Write 2 Mode to Normal Mode>>>>

The condition for transition of the switching control IC 10b to the write 2 mode (S100) is as described above.

Moreover, when the user Y operates the tester to set such that the voltage Vcc is lower than the voltage V5 (for example, 9 V), the reset circuit 21 outputs the high reset signal rst. Then, the switching control IC 10b transitions from the write 2 mode (S100) to the normal mode (S102). In this case, the setting information held in the registers 51 to 54 is reset. The switching control IC 10b is thereby reset and can be guaranteed to start in the normal mode if the voltages Vca, Vfb, and Vcc are in the voltage ranges of the normal operation upon release of the reset.

<<<<Transition to Write 1 Mode>>>>

Furthermore, when the user Y operates the tester to set such that the voltage Vca is higher than the voltage V1 and the voltage Vcc is higher than the voltage V2, the switching control IC 10b transitions to the write 1 mode (S103). This can prevent the switching control IC 10b from erroneously operating in the test mode or the write 2 mode in the case where the user Y does not use the tester.

In this case, the switching circuit 30 causes the BO terminal circuit 40 and the STB terminal circuit 41 to operate. Then, the memory interface circuit 42 writes the setting information into the storage circuit 32 based on the clock signal inputted via the terminal BO and the setting information deadtime inputted via the terminal STB. Thus, the memory interface circuit 42 writes the setting information deadtime into the non-volatile memory 50 or the register 54.

<<<<Transition from Write 1 Mode to Write 2 Mode>>>>

Then, when the user Y operates the tester to set such that the voltages Vca and Vfb are higher than the voltage V1 and the voltage Vcc is higher than the voltage V2, the switching control IC 10b transitions from the write 1 mode (S103) to the write 2 mode (S100). This transition is not normally used but is a transition condition for verifying the operation of the setting circuit 24.

<<<<Transition from Write 1 Mode to Normal Mode>>>>

Moreover, when the user Y operates the tester to set such that the power supply voltage Vcc is lower than the voltage V5, the reset circuit 21 outputs the high reset signal rst. Then, the switching control IC 10b transitions from the write 1 mode (S103) to the normal mode (S102). In this case, the setting information held in the registers 51 to 54 is reset, and then the memory interface circuit 42 writes the setting information stored in the non-volatile memory 50 into the registers 51 to 54. The switching control IC 10b is thereby reset and can be guaranteed to start in the normal mode if the voltages Vca, Vfb, and Vcc are in the voltage ranges of the normal operation upon release of the reset.

<<<<Transition to Normal Mode>>>>

Lastly, when the user Y operates the tester to set such that the voltage Vca is lower than the voltage V4 (for example, 3.8 V) and the voltage Vcc is higher than the voltage V2, the switching control IC 10b transitions to the normal mode (S102). In this case, the memory interface circuit 42 writes the setting information stored in the non-volatile memory 50 into the registers 51 to 54. The switching control IC 10b can thereby operate in the normal mode and control the DC-DC convertor 102 when the voltages Vca and Vcc are in the voltage ranges of the normal operation.

<<<Waveform of Operation When Transitioning from Write 2 Mode to Normal Mode>>>

Figure 9:
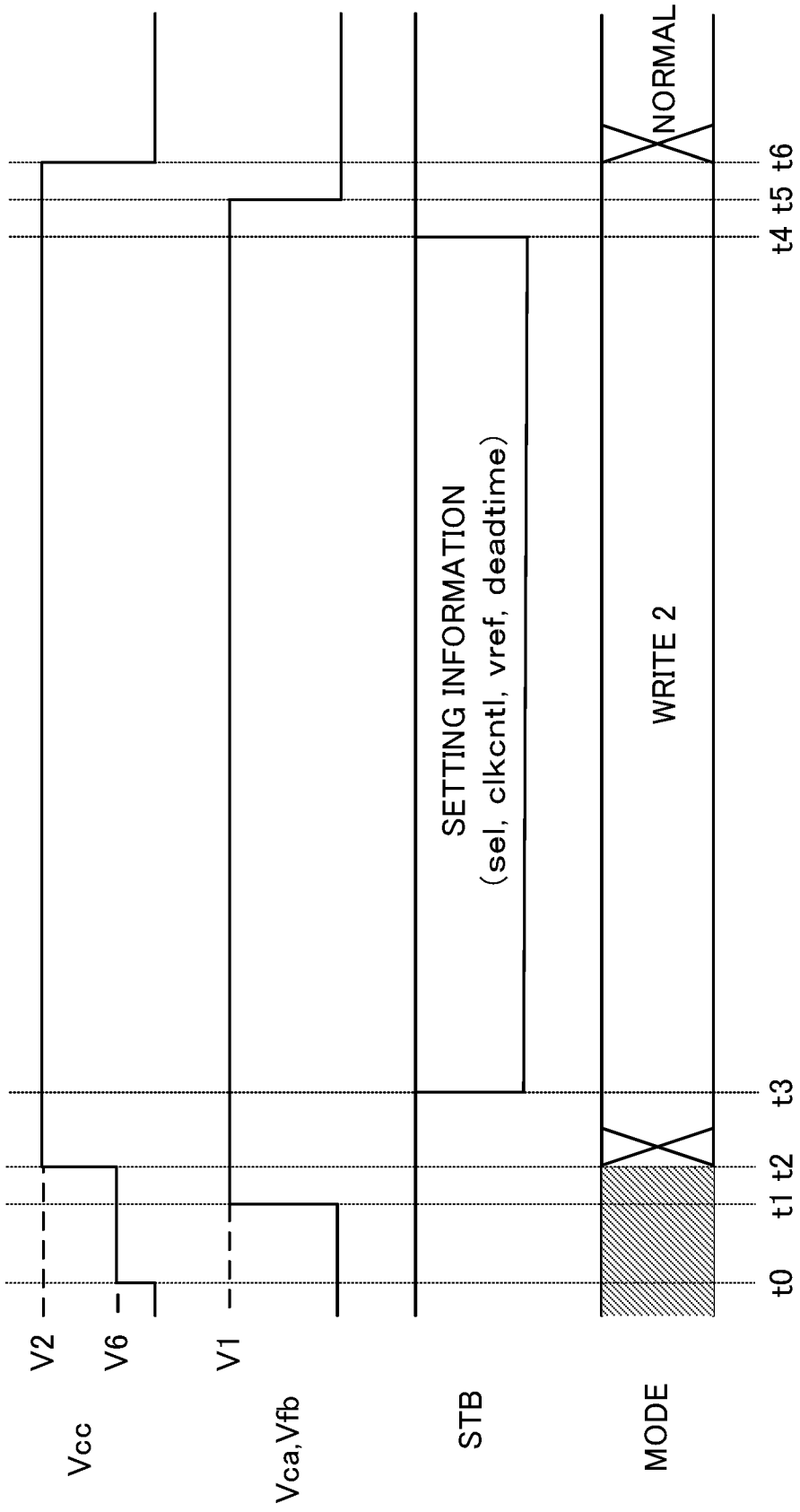
FIG. 9 is a diagram illustrating an example of an operation of transitioning from a write 2 mode to a normal mode.

FIG. 9 is a diagram illustrating an example of an operation of transitioning from the write 2 mode to the normal mode.

When the user Y operates the tester to set such that the voltage Vcc is a voltage V6 (for example, 6.5 V) at time to, the switching control IC 10*b* becomes able to determine the voltages Vca and Vfb from the terminals CA and FB.

When the user Y operates the tester to set such that the voltages Vca and Vfb are the voltage V1 at time t1, and operates the tester to set such that the voltage Vcc is the voltage V2 at time t2, the switching control IC 10*b* transitions to the write 2 mode.

When the user Y operates the tester to set such that the setting information is inputted from the terminal STB at time t3, the switching control IC 10*b* starts writing the setting information into the storage circuit 32 via the STB terminal circuit 41 and the memory interface circuit 42.

The user Y operates the tester to complete the writing of the setting information at time t4.

When the user Y operates the tester to set such that the voltages Vca and Vfb is 0 V at time t5, and operates the tester to set such that the voltage Vcc is 0 V at time t6, to thereby reset the switching control IC 10*b*, the switching control IC 10*b* transitions from the write 2 mode to the normal mode.

The switching control IC 10*b* is thereby reset and can be guaranteed to start in the normal mode if the voltages Vca, Vfb, and Vcc are in the voltage ranges of the normal operation upon release of the reset.

<<<Waveform of Operation when Transitioning from Write 2 Mode to Test Mode>>>

Figure 10:
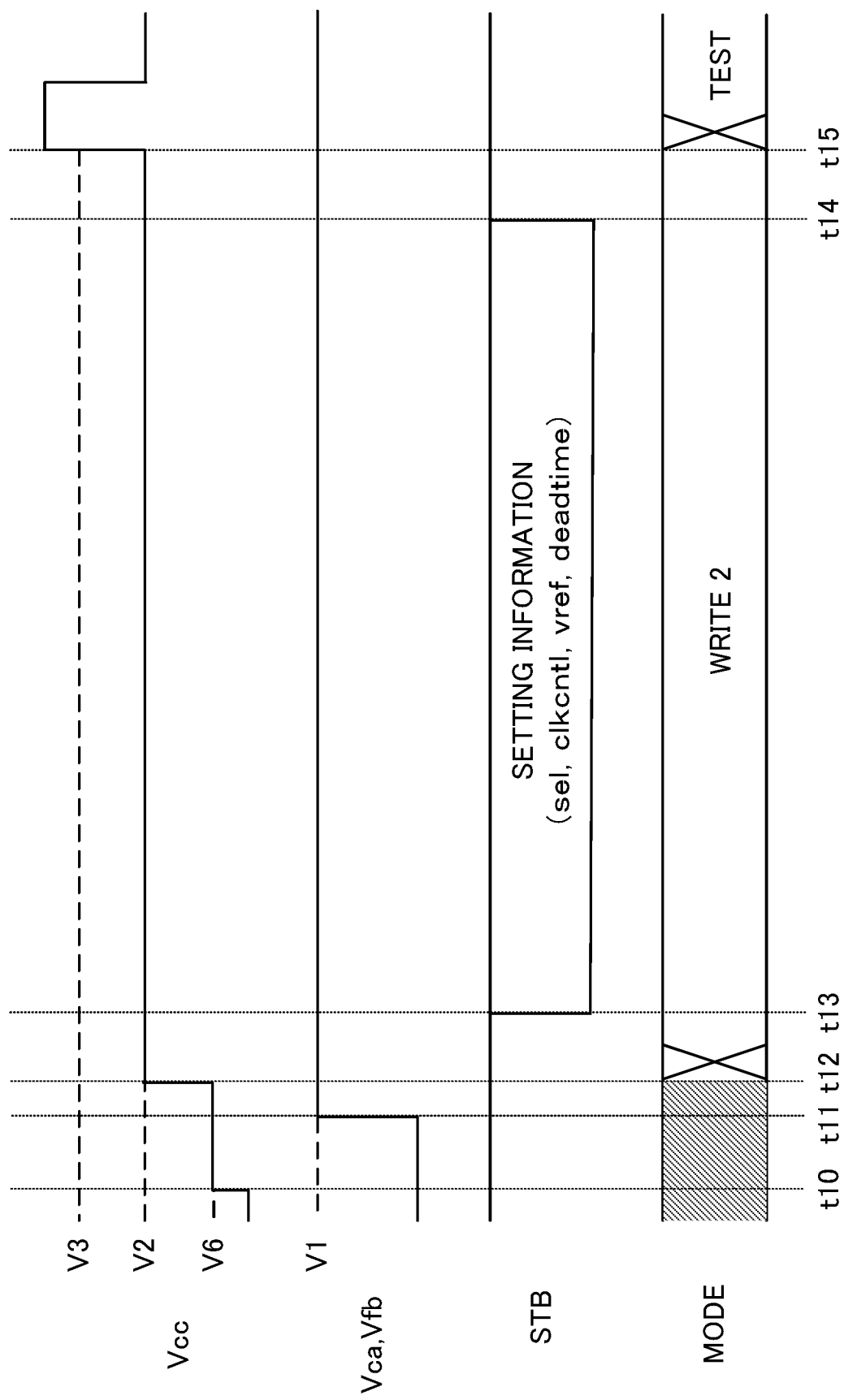
FIG. 10 is a diagram illustrating an example of a transition operation from a write 2 mode to a test mode.

FIG. 10 is a diagram illustrating an example of an operation of transitioning from the write 2 mode to the test mode.

When the user Y operates the tester to set such that the voltage Vcc is the voltage V6 (for example, 6.5 V) at time t10, the switching control IC 10*b* becomes able to determine the voltages Vca and Vfb from the terminals CA and FB.

When the user Y operates the tester to set such that the voltages Vca and Vfb are the voltage V1 at time t11, and operates the tester to set such that the voltage Vcc is the voltage V2 at time t12, the switching control IC 10*b* transitions to the write 2 mode.

When the user Y operates the tester to set such that the setting information is inputted from the terminal STB at time t13, the switching control IC 10*b* starts writing the setting information into the storage circuit 32 via the STB terminal circuit 41 and the memory interface circuit 42.

The user Y operates the tester to complete the writing of the setting information at time t14.

When the user Y operates the tester to set such that the voltage Vcc is higher than the voltage V3 at time t15, the switching control IC 10*b* transitions from the write 2 mode to the test mode.

Moreover, transitioning from the write 2 mode (S100) to the test mode (S101) by setting the voltage Vcc higher than the voltage V3 enables reduction in the time period for transitioning from the write 2 mode to the test mode.

Modification Example

<<<Outline of DC-DC Convertor 104>>>

Figure 11:
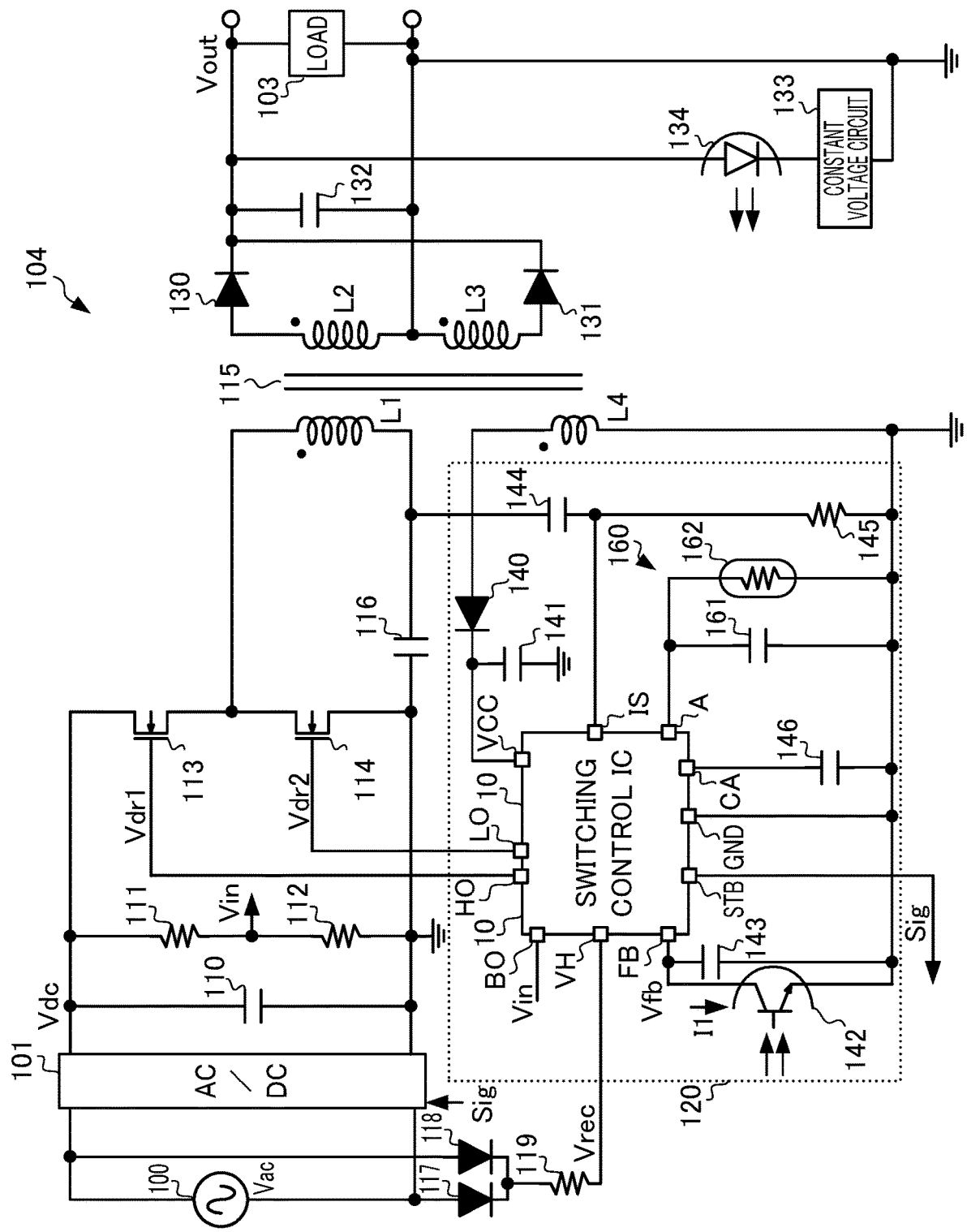
FIG. 11 is a diagram illustrating an example of a configuration of a DC-DC convertor 104.

FIG. 11 is a diagram illustrating an example of a configuration of a DC-DC convertor 104. Note that the DC-DC convertor 104 is an example of a configuration in the case where the OTP 18 is connected to the terminal A based on the setting information sel. Moreover, the components that are the same between FIGS. 1 and 11 are given the same reference numerals.

The configuration of the DC-DC convertor 104 is different from that of the DC-DC convertor 102 of FIG. 1 in a portion corresponding to an external circuit 160. Moreover, the external circuit 160 is an external circuit when the OTP 18 is connected to the terminal A. An operation of the external circuit 160 is described below.

The external circuit 160 detects the temperature of the DC-DC convertor 104, and includes a capacitor 161 and an NTC thermistor 162.

When the DC-DC convertor 104 overheats, the voltage Va at the terminal A drops. As a result, the OTP 18 causes the drive circuit 13 to stop generating the drive signals Vdr1 and Vdr2. The capacitor 161 is provided to stabilize the voltage generated at the terminal A.

This can prevent the switching control IC 10*b* from being destroyed by heat even if the DC-DC convertor 104 overheats.

<<<Outline of DC-DC Convertor 105>>>

Figure 12:
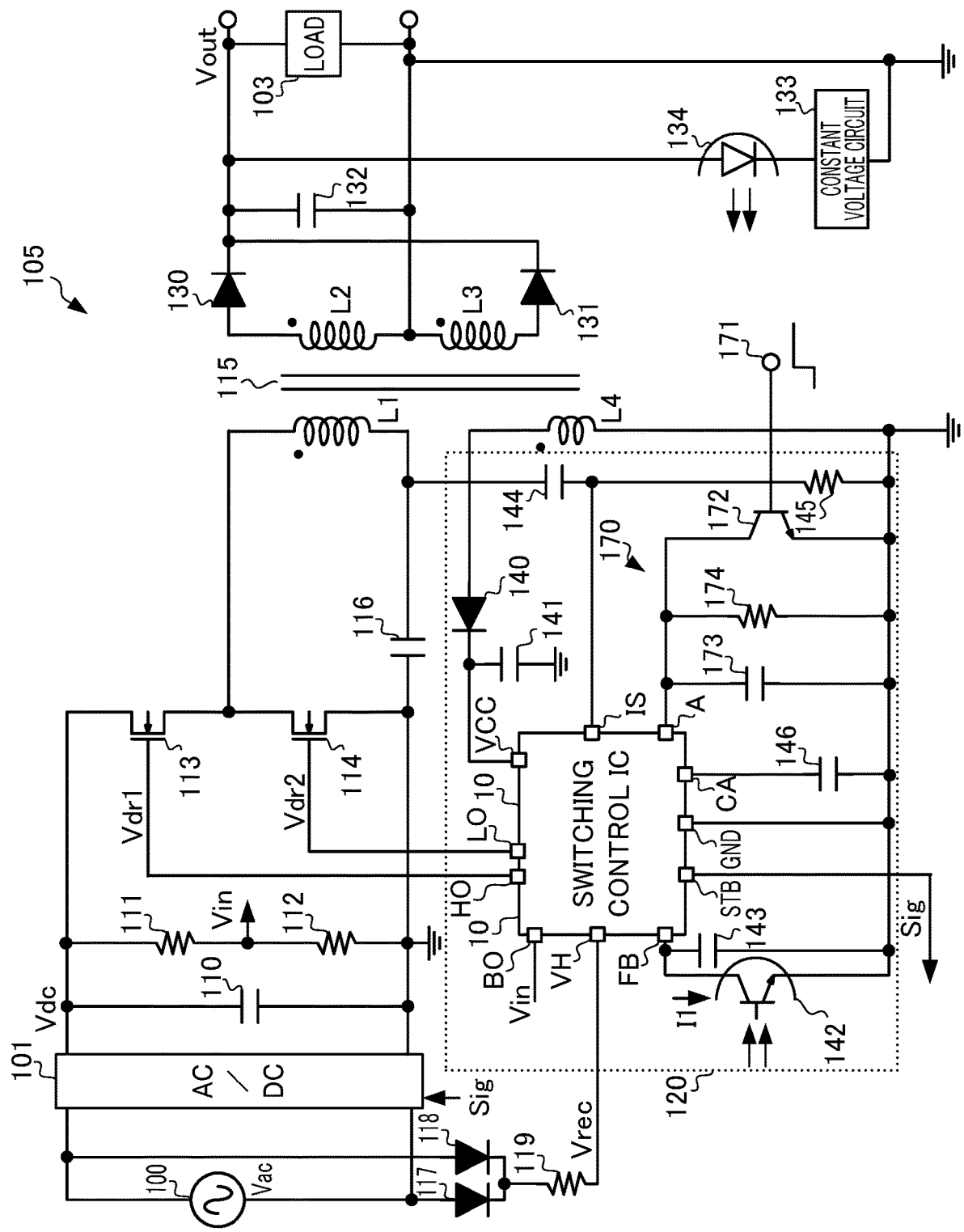
FIG. 12 is a diagram illustrating an example of a configuration of a DC-DC convertor 105.

FIG. 12 is a diagram illustrating an example of a configuration of a DC-DC convertor 105. Note that the DC-DC convertor 105 is an example of a configuration in the case where the MODE 19 is connected to the terminal A based on the setting information sel. Moreover, the components that are the same between FIGS. 1 and 12 are given the same reference numerals.

The configuration of the DC-DC convertor 105 is different from the configurations of the DC-DC convertor 102 of FIG. 1 and the DC-DC convertor 104 of FIG. 11 in a portion corresponding to an external circuit 170. Moreover, the external circuit 170 is an external circuit when the MODE 19 is connected to the terminal A. An operation of the external circuit 170 is described below.

The external circuit 170 is used for the switching control IC 10*b* to receive a signal inputted to a terminal 171 from a MCU (not illustrated) and/or the like in the DC-DC convertor 105, and includes an NPN transistor 172, a capacitor 173, and a resistor 174.

Moreover, when the MCU outputs a high signal, the NPN transistor 172 is turned on and the voltage Va at the terminal A drops. As a result, the MODE 19 causes the drive circuit 13 to stop generating the drive signals Vdr1 and Vdr2. Moreover, when the MCU outputs a low signal and then the capacitor 173 is charged with a predetermined source current supplied to the terminal A, to thereby raise the voltage Va at the terminal A, the MODE 19 causes the drive circuit 13 to resume generating the drive signals Vdr1 and Vdr2.

This enables the MCU in the DC-DC convertor 105 to control the operation of the switching control IC 10*b* of the DC-DC convertor 105.

SUMMARY

The DC-DC convertor 102 according to an embodiment of the present disclosure has been described above. The switching control IC 10*b* switches the operation mode of the switching control IC 10*b* based on the voltage levels at the terminals VCC and CA. Moreover, the memory control circuit 31 writes the setting information into the storage circuit 32 in the write 1 mode or the write 2 mode. Then, the drive circuit 13, the reference voltage generation circuit 16*b*, the PGS 17, the OTP 18, the MODE 19, and the clock signal output circuit 26 operate based on the setting information stored in the storage circuit 32 in the test mode of the operation mode. This enables the switching control IC 10*b* including the storage circuit 32 to write the setting information into the storage circuit 32 without using a dedicated terminal. Accordingly, it is possible to provide a technique capable of adjusting an operation of an integrated circuit without using a dedicated terminal.

In addition, the BO terminal circuit 40 receives the setting information inputted to the terminal BO, and the memory interface circuit 42 writes the setting information received by the BO terminal circuit 40 into the storage circuit 32. This makes it possible to receive, from the outside, the setting information to be stored in the storage circuit 32, without using a dedicated terminal.

Furthermore, the storage circuit 32 includes the non-volatile memory 50 and the registers 51 to 54, and the memory interface circuit 42 writes the setting information into the registers 51 to 54 when the switching control IC 10*b* operates in the write 1 mode or the write 2 mode. Then, the drive circuit 13, the reference voltage generation circuit 16*b*, the PGS 17, the OTP 18, the MODE 19, and the clock signal output circuit 26 operate based on the setting information stored in the registers 51 to 54 when the switching control IC 10*b* operates in the test mode. This makes it possible to test the switching control IC 10*b* without writing the setting information into the non-volatile memory 50, and thus prevent exceeding the limited number of times of rewrites in the non-volatile memory 50. Moreover, it is possible to use the setting information swiftly, by using the information stored in the registers 51 to 54 which can be read faster than that stored in the non-volatile memory 50.

Moreover, the drive circuit 13, the reference voltage generation circuit 16*b*, the PGS 17, the OTP 18, and the MODE 19 operate based on the setting information stored in the non-volatile memory 50 when the switching control IC 10*b* operates in the normal mode. This makes it possible to adjust the operation of the switching control IC 10*b* without using a fuse, and attempt an adjustment of the operation later.

Furthermore, the memory interface circuit 42 writes the setting information that is to be used in the operation of the switching control IC 10*b* in the normal mode, into the non-volatile memory 50, when the switching control IC 10*b* operates in the write 1 mode or the write 2 mode. Then, the memory interface circuit 42 writes the setting information stored in the non-volatile memory 50 into the registers 51 to 54 when the switching control IC 10*b* operates in the normal mode. The drive circuit 13, the reference voltage generation circuit 16*b*, the PGS 17, the OTP 18, and the MODE 19 operate based on the setting information stored in the registers 51 to 54 when the switching control IC 10*b* operates in the normal mode. Accordingly, only the setting information needed when the switching control IC 10*b* operates in the normal mode is written in the non-volatile memory 50, thereby being able to minimize the volume of the non-volatile memory 50.

Moreover, the clock signal output circuit 26 outputs the first clock signal when the switching control IC 10*b* operates in the normal mode, and outputs the second clock signal having a frequency higher than that of the first clock signal when the switching control IC 10*b* operates in the test mode. Then, the OCP 15 operates at a frequency based on the first clock signal or the second clock signal. This makes it possible to reduce a test time period when the switching control IC 10*b* operates in the test mode.

Furthermore, the switching circuit 30 causes the switching control IC 10*b* to operate in the write 1 mode or the write 2 mode, when the voltage level at the terminal CA is outside the voltage range of the normal operation and the voltage level at the terminal VCC is outside the voltage range of the normal operation. This makes it possible to use the terminal VCC, which is normally used as a power supply terminal of the switching control IC 10*b*, to switch the operation mode of the switching control IC 10*b*. Then, the terminal CA can be used to switch the operation mode of the switching control IC 10*b*, thereby being able to control the memory with a small number of pins while reducing effects on the normal operation of the switching control IC 10*b*.

Moreover, the switching circuit 30 causes the switching control IC 10*b* to operate in the normal mode, when the voltage level at the terminal VCC is within the voltage range of the normal operation and the voltage level at the terminal CA is within the voltage range of the normal operation. This enables terminals VCC and CA, which are to be used in switching the operation mode, to be used also in the normal operation.

Furthermore, the switching control IC 10 includes the terminal A, and the PGS 17, the OTP18, and/or the MODE 19 is connected to the terminal A according to the setting information, to operate. This makes it possible to provide a product having series by using the same integrated circuit without using a fuse.

Moreover, when one of the OTP 18 and the MODE 19 detects abnormality, the drive circuit 13 stops driving the NMOS transistors 113 and 114. This makes it possible to enhance safety of the DC-DC convertor 102, with a user's desired function constituting the DC-DC convertor 102 using the switching control IC 10*b*.

In addition, the switching control IC 10*b* is desirably used in the DC-DC convertors 102, 104, and 105.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

According to the present disclosure, it is possible to provide a technique capable of adjusting an operation of an integrated circuit without using a dedicated terminal.

What is claimed is:

1. An integrated circuit for a power supply circuit that generates an output voltage at a target level from an input voltage, the power supply circuit including
   an inductor, and
   a transistor configured to control an inductor current flowing through the inductor,
the integrated circuit being configured to perform switching of the transistor, the integrated circuit comprising:
   a first terminal that receives a power supply voltage for operating the integrated circuit;
   a second terminal that receives a voltage corresponding to an operation state of the integrated circuit;
   a storage circuit;
   a switching circuit configured to switch an operation mode of the integrated circuit based on voltage levels at the first and second terminals, the operation mode including a write mode, a test mode and a normal mode;
   a memory control circuit configured to write setting information into the storage circuit, when the integrated circuit operates in the write mode; and
   a setting target circuit configured to operate based on the setting information stored in the storage circuit, when the integrated circuit operates in the test mode.

2. The integrated circuit according to claim 1, further comprising a third terminal that receives the setting information, wherein
the power supply voltage is generated according to the switching of the transistor; and
the memory control circuit includes:
a reception circuit configured to receive the setting information received at the third terminal, when the integrated circuit operates in the write mode, and
a memory interface circuit configured to write the setting information received by the reception circuit into the storage circuit.

3. The integrated circuit according to claim 2, wherein
the storage circuit includes a register and a non-volatile memory,
the memory interface circuit writes the setting information into the register, when the integrated circuit operates in the write mode, and
the setting target circuit operates based on the setting information stored in the register, when the integrated circuit operates in the test mode.

4. The integrated circuit according to claim 3, wherein the setting target circuit operates based on the setting information stored in the storage circuit, when the integrated circuit operates in the normal mode.

5. The integrated circuit according to claim 4, wherein
the memory interface circuit
writes the setting information in the normal mode into the non-volatile memory, when the integrated circuit operates in the write mode, and
writes the setting information stored in the non-volatile memory into the register, when the integrated circuit operates in the normal mode; and
the setting target circuit operates based on the setting information stored in the register, when the integrated circuit operates in the normal mode.

6. The integrated circuit according to claim 5, further comprising a clock signal output circuit configured to
output a first clock signal of a first frequency, when the integrated circuit operates in the normal mode, and
output a second clock signal of a second frequency higher than the first frequency, when the integrated circuit operates in the test mode, wherein
the setting target circuit includes a digital circuit configured to operate at a third frequency based on the inputted first or second clock signal.

7. The integrated circuit according to claim 4, wherein the switching circuit causes the integrated circuit to operate in the write mode, when the voltage level at the second terminal is outside a first range, the first range being a voltage range of the voltage at the second terminal for operating the integrated circuit in the normal mode.

8. The integrated circuit according to claim 7, wherein the switching circuit causes the integrated circuit to operate in the test mode, when the voltage level at the first terminal is outside a second range, the second range being a voltage range of the power supply voltage at the first terminal for operating the integrated circuit in the normal mode.

9. The integrated circuit according to claim 8, wherein the switching circuit causes the integrated circuit to operate in the normal mode, when the voltage level at the first terminal is within the second range and the voltage level at the second terminal is within the first range.

10. The integrated circuit according to claim 1, further comprising:
a fourth terminal; and
a selection circuit, wherein
the setting target circuit is connected to the fourth terminal, and includes:
a first detection circuit configured to detect abnormality in the power supply circuit based on a voltage level at the fourth terminal, and
a second detection circuit configured to detect abnormality in the integrated circuit;
the selection circuit causes one of the first and second detection circuits to operate based on the setting information stored in the storage circuit.

11. The integrated circuit according to claim 10, further comprising a drive circuit configured to
drive the transistor based on the output voltage, and
stop driving the transistor, when the first detection circuit detects the abnormality in the power supply circuit.

12. A power supply circuit configured to generate an output voltage at a target level from an input voltage, the power supply circuit comprising:
an inductor;
a transistor configured to control an inductor current flowing through the inductor; and
an integrated circuit configured to perform switching of the transistor, wherein the integrated circuit includes:
a first terminal that receives a power supply voltage for operating the integrated circuit;
a second terminal that receives a voltage corresponding to an operation state of the integrated circuit;
a storage circuit;
a switching circuit configured to switch an operation mode of the integrated circuit based on voltage levels at the first and second terminals, the operation mode including a write mode, a test mode and a normal mode;
a memory control circuit configured to write setting information into the storage circuit, when the integrated circuit operates in the write mode; and
a setting target circuit configured to operate based on the setting information stored in the storage circuit, when the integrated circuit operates in the test mode.

13. The power supply circuit according to claim 12, further comprising a third terminal that receives the setting information, wherein
the power supply voltage is generated according to the switching of the transistor; and
the memory control circuit includes:
a reception circuit configured to receive the setting information received at the third terminal, when the integrated circuit operates in the write mode, and
a memory interface circuit configured to write the setting information received by the reception circuit into the storage circuit.

* * * * *